United States Patent
Van Der Sluis et al.

(10) Patent No.: US 7,923,813 B2
(45) Date of Patent: Apr. 12, 2011

(54) ANTI-FUSE MEMORY DEVICE

(75) Inventors: Paul Van Der Sluis, Eindhoven (NL);
Andrei Mijiritskii, Zaltbommel (NL);
Pierre H. Woerlee, Valkenswaard (NL);
Victor M. G Van Acht, Waalre (NL);
Nicolaas Lambert, Waalre (NL)

(73) Assignee: NXP B.V., Eindhoven (NL)

( * ) Notice: Subject to any disclaimer, the term of this patent is extended or adjusted under 35 U.S.C. 154(b) by 297 days.

(21) Appl. No.: 11/914,662

(22) PCT Filed: May 4, 2006

(86) PCT No.: PCT/IB2006/051406
§ 371 (c)(1),
(2), (4) Date: Oct. 23, 2008

(87) PCT Pub. No.: WO2006/126110
PCT Pub. Date: Nov. 30, 2006

(65) Prior Publication Data
US 2009/0072212 A1     Mar. 19, 2009

(30) Foreign Application Priority Data
May 24, 2005 (EP) .................................... 05104378

(51) Int. Cl.
*H01L 23/52* (2006.01)
*H01L 21/70* (2006.01)

(52) U.S. Cl. . 257/530; 257/529; 257/390; 257/E27.102; 257/E27.103

(58) Field of Classification Search .................. 257/209, 257/529, 530, E27.102, E27.103, 390; 438/658–601, 438/666–670, 686–688
See application file for complete search history.

(56) References Cited

U.S. PATENT DOCUMENTS

| | | | | |
|---|---|---|---|---|
| 3,959,799 A | * | 5/1976 | Gambino et al. | 430/524 |
| 5,120,679 A | | 6/1992 | Boardman et al. | |
| 5,290,734 A | | 3/1994 | Boardman et al. | |
| 5,296,716 A | * | 3/1994 | Ovshinsky et al. | 257/3 |
| 5,308,795 A | * | 5/1994 | Hawley et al. | 438/600 |
| 5,328,865 A | | 7/1994 | Boardman et al. | |
| 5,387,311 A | | 2/1995 | Hall et al. | |
| 5,463,244 A | * | 10/1995 | De Araujo et al. | 257/530 |

(Continued)

OTHER PUBLICATIONS

Charai et al. A comparison between aluminum and copper interactions with high-temperature oxide and nitride diffusion barriers. J. Vac. Sci. Technol. A 7 93), May/Jun. 1989, pp. 784-789.*

(Continued)

*Primary Examiner* — Lynne A Gurley
*Assistant Examiner* — Galina Yushina

(57) ABSTRACT

A One Time Programmable (OTP) memory cell (10) comprising a first, metallic layer (12) coated with a second, conductive stable transition compound (14) with an insulating layer (16) there-between. The first and second layers (12, 14) are selected according to the difference in Gibbs Free Energy between them, which dictates the chemical energy that will be generated as a result of an exothermic chemical reaction between the two materials. The materials of the first and second layers (12, 14) are highly thermally stable in themselves but, when a voltage is applied to the cell (10), a localized breakdown of the insulative layer (16) results which creates a hotspot (18) that sets off an exothermic chemical reaction between the first and second layers (12, 14). The exothermic reaction generates sufficient heat (20) to create a short circuit across the cell and therefore reduce the resistance thereof.

10 Claims, 5 Drawing Sheets

U.S. PATENT DOCUMENTS

| | | | |
|---|---|---|---|
| 5,495,436 A | | 2/1996 | Callahan |
| 5,573,970 A | | 11/1996 | Pramanik et al. |
| 5,789,795 A | | 8/1998 | Sanchez et al. |
| 5,793,094 A | | 8/1998 | Sanchez et al. |
| 5,962,910 A | * | 10/1999 | Hawley et al. ............... 257/530 |
| 6,090,701 A | * | 7/2000 | Hasunuma et al. ........... 438/632 |
| 6,147,395 A | * | 11/2000 | Gilgen ........................ 257/529 |
| 6,156,588 A | | 12/2000 | Sanchez et al. |
| 6,416,929 B2 | * | 7/2002 | Fukano et al. ............ 430/270.12 |
| 6,444,502 B1 | | 9/2002 | Sanchez et al. |
| 6,553,911 B1 | * | 4/2003 | Walker et al. .............. 102/202.7 |
| 6,737,686 B2 | * | 5/2004 | Fricke et al. ................. 257/209 |
| 2003/0230770 A1 | | 12/2003 | Fricke et al. |
| 2004/0246766 A1 | | 12/2004 | Lung et al. |

OTHER PUBLICATIONS

Zhang, G; et al. "An Electro-Thermal Model for Metal-Oxide-Metal Antifuses" IEEE Transactions On Electron Devices, IEEE Service Center, Pisacataway, NJ, US, vol. 42, No. 8, Aug. 1, 1995, pp. 1548-1557.

* cited by examiner

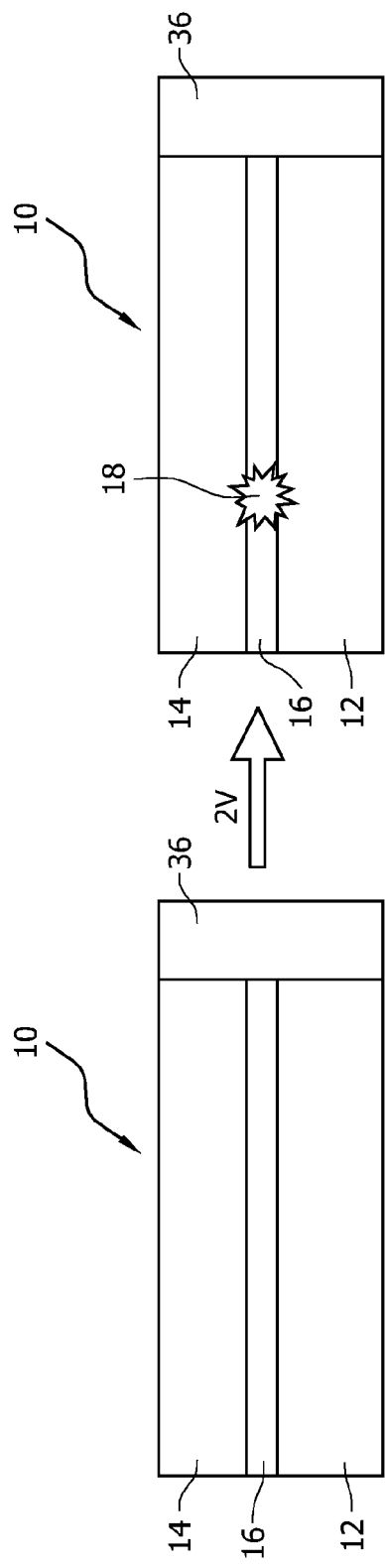
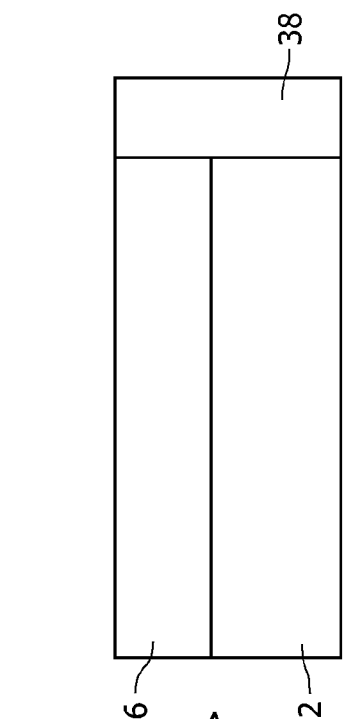
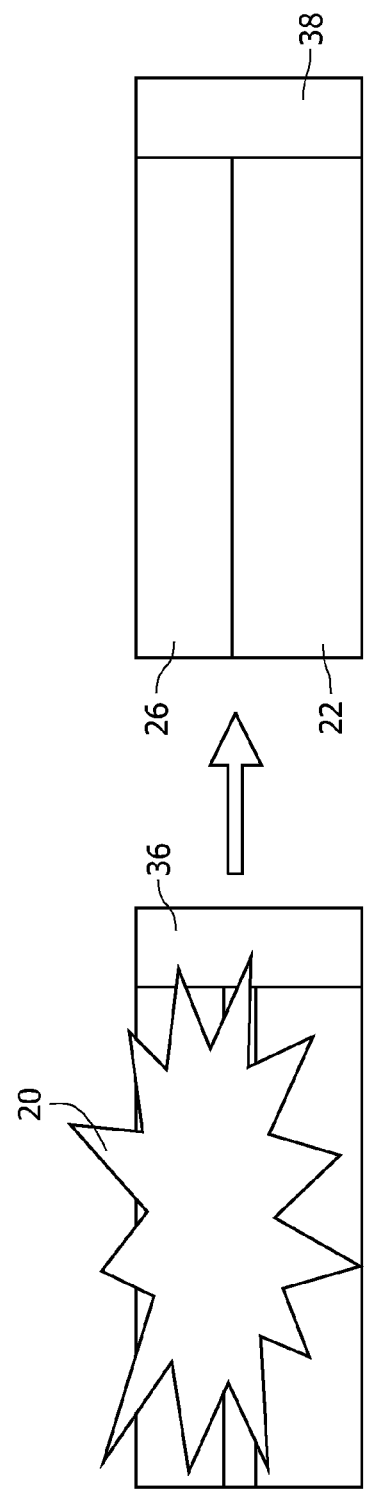
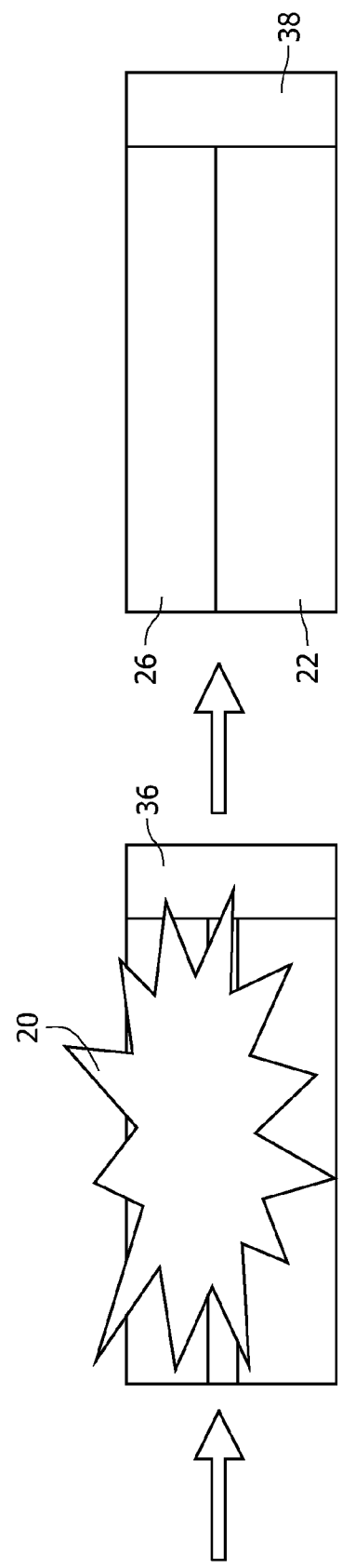

ANTI-FUSE MEMORY DEVICE

The invention relates generally to a non-volatile programmable memory device and, more particularly, to a One Time Programmable (OTP) memory cell and a method of manufacturing same.

There is an increasing demand for cost-effective memory modules which offer the advantage of reduced size, improved storage capacity, and extremely long retention time. Resistance-based memory devices are an attractive option for such memories. A resistance-based memory module may be, for example, a field programmable gate array (FPGA) or a programmable read-only memory (PROM), among others. Each memory cell in a resistance-based memory module comprises a resistive memory component, such as, for example, a fuse or an anti-fuse. The resistance value of any one memory cell can be configured to be relatively high, which translates to a logic bit value of '0', or relatively low, which translates to a logic bit value of '1'. The resistance of a selected memory cell can be determined by applying a voltage to the memory cell and measuring the current that flows through it.

One Time Programmable (OTP) cells can be programmed only once; they do not lose the stored information when the memory device is no longer supplied with power, nor can the information be erased to enable re-programming. The information can be erased by writing all cells. Many different types of non-volatile OTP memory cells are known. For example, U.S. Pat. No. 6,737,686 describes a memory cell which includes a heating component and a voltage breakdown component (in the form of an exothermic material) that are in contact with each other. When the memory cell is to be programmed with a desired logical bit value, a voltage is applied across the memory cell causing a current to pass through it. This current causes an increase in the temperature of the heating component. If the voltage breakdown component is a fuse, then this increase in temperature accelerates the disintegration of a conductive pathway provided by the voltage breakdown component. When a conductive pathway disintegrates, the resistance of the memory cell increases to a level that represents a desired logical bit value. If the voltage breakdown component is an anti-fuse, then the increase in temperature may accelerate the formation of a conductive pathway in the voltage breakdown component.

However, the use of a heating component to accelerate the exothermic reaction of an already exothermic material may have an adverse effect on the long-term stability of the cell.

It is therefore an object of the present invention to provide a non-volatile programmable memory cell in which the voltage breakdown element does not, in itself, need to be formed of an exothermic material and in which a heating component does not need to be employed.

In accordance with the present invention, there is provided a method of manufacturing a non-volatile memory cell having at least two terminals programmable by applying a voltage across said terminals so as to change the resistance thereof from a first, relatively high resistance representative of a first logical bit value to a second, relatively low resistance representative of a second logical bit value, the method comprising the step of forming a stack comprising a plurality of layers of material including a first layer of conductive material and a second layer of conductive material with a layer of insulative material therebetween, said second conductive material comprising a stable compound, said layer of insulative material being such that the application of said voltage to said cell causes a localized breakdown of said insulative layer, the method further comprising the step of selecting said first and second layers of conductive material such that the heat created by said localized breakdown of said insulative layer initiates an exothermic chemical reaction therebetween so as to generate sufficient energy in said cell to change the state of at least a portion of one of said layers of said stack and create a stable short circuit between said terminals and reduce the resistance of said memory cell from said first, relatively high resistance to said second, relatively low resistance.

Both the first and second conducting layers are highly thermally stable in themselves and can be made to react exothermically with each other to amplify the energy within the cell to a desired level. This is achieved by the chemical energy generated as a result of the exothermic reaction, which is dependent on the difference in Gibbs Free Energy between the materials of the first and second conductive layers.

The second conductive material is beneficially a stable compound and, more particularly, a stable oxide, such as $RuO_2$, $In_2O_3$, $NiO$, $ZnO$, $Ag_2O$ and $IrO_2$. In this case, the insulative layer may be a native or specially made, oxide of a metal of the first conductive layer, or a third material such as Si or the like. The first conductive layer may comprise one or more of Al, Al/Ag mixture and the like.

In a first embodiment, as a result of the exothermic chemical reaction between the first and second conductive layers, a short is created between the first and second layers. In an alternative embodiment, a layer of amorphous phase change material may be provided between the terminals, which is selected such that the energy generated in the cell as a result of the exothermic chemical reaction causes it to change to a conductive crystalline phase change material, thereby creating a short circuit between the terminals.

The present invention extends to a non-volatile memory cell having at least two terminals, and being programmable by applying a voltage between said terminals, so as to change the resistance thereof from a first, relatively high resistance representative of a first logical bit value to a second, relatively low resistance representative of a second logical bit value, said memory cell comprising a stack comprising a plurality of layers of material including a first layer of conductive material coated with a second layer of conductive material with an insulative layer therebetween, said second conductive material comprising a transition compound, wherein the application of said voltage to said cell causes a localized breakdown of said insulative layer, said first and second layers of conductive material being selected such that the heat created by said localized breakdown of said insulative layer initiates an exothermic chemical reaction therebetween so as to generate sufficient energy in said cell to change the state or chemical composition of at least a portion of one of said layers of said cell and create a short circuit between said terminals and reduce the resistance of said memory cell from said first, relatively high, resistance to said second, relatively low resistance.

The present invention extends further to a memory element comprising a memory cell as defined above deposited on a via connected to a separate programmable register, programmable analog switch, or other circuitry.

The present invention extends further to a memory element comprising a memory cell as defined above deposited on a via connected to a memory device comprising an array of such memory elements connected between select, row and column voltage lines (often referred to as a crossover or a crossbar structure with no selection element in a cell.

The present invention extends further to a memory element comprising a memory cell as defined above deposited on a via connected to a transistor, diode or other bipolar device, and to a memory device comprising an array of such memory elements connected between select, row and column voltage lines.

These and other aspects of the present invention will be apparent from, and elucidated with reference to, the embodiments described herein.

Embodiments of the present invention will now be described by way of examples only and with reference to the accompanying drawings, in which:

FIGS. 4A to 4D are schematic cross-sectional illustrations of a chemically assisted fuse for a memory cell according to a fourth exemplary embodiment of the present invention;

Thus, the present invention provides a non-volatile memory cell in the form of a stack comprising, generally, first and second layers of conductive material with a layer of isolating material, in the form of an anti-fuse therebetween. Both conducting layers are highly thermally stable in themselves, but can be made to react exothermically with each other to amplify the energy required to short the anti-fuse and decrease the resistance of the cell to represent a desired logical bit value.

Spontaneous reactions often have
a negative enthalpy (release of heat energy, $\Delta H<0$)
an increase in entropy (increase in disorder, $\Delta S>0$)

In other words, the spontaneity of a reaction appears to involve two thermodynamic properties: enthalpy and entropy. Furthermore, spontaneous reactions are those that go downhill in energetic terms, i.e. the final state has a lower energy content than the initial state. Gibbs came up with an equation, combining both enthalpy and entropy contributions, that provides a means to describe energy content and therefore a means to evaluate the spontaneity of a reaction when that energy content changes. The energy contents of a substance is termed the Gibbs Free Energy and is defined by the Gibbs Free Energy equation:

$$G=H-T*S$$

The free energy of a substance equals stored heat energy minus inherent disorder times temperature, where H is enthalpy, S is entropy and T is the temperature in Kelvin. In application to the present invention, the reaction should only occur at relatively high temperatures, i.e. some activation barrier needs to be present.

In the non-volatile memory cell of the present invention, the degree of exothermal reactivity between the two layers of conductive material is based on the chemical energy generated from a difference in Gibbs Free Energy between the different materials, and the idea in this case is to use chemical energy to amplify the energy required to short an anti-fuse for a One Time Programmable (OTP) memory. An additional advantage of this approach is that size of the selection transistor can be minimized.

Figure 1A:
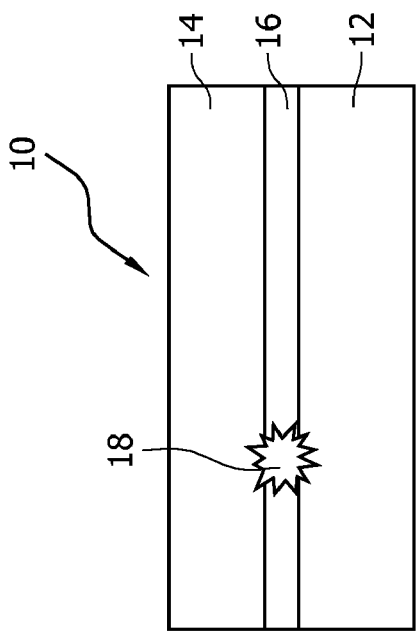
FIGS. 1A to 1D are schematic cross-sectional illustrations of a chemically assisted fuse for a memory cell according to a first exemplary embodiment of the present invention.
Figure 1B:
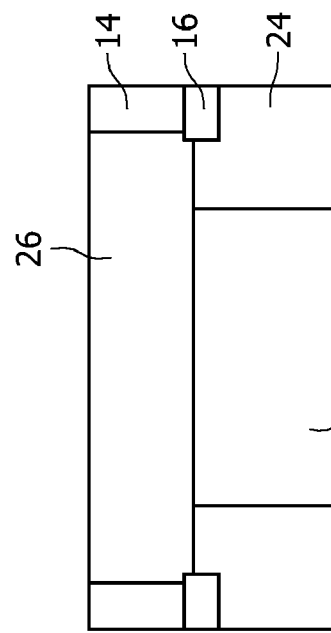

Referring to FIG. 1a of the drawings, a memory cell 10 according to a first exemplary embodiment of the present invention comprises a layer 12 of Aluminium (Al) which is coated (by, for example, reactive sputtering or metalorganic chemical vapour deposition) with a $RuO_2$ (Ruthenium dioxide) film 14. A very thin (1-2 nm) native $Al_2O_3$ layer 16 is formed automatically and prevents a short between the aluminium and $RuO_2$ layers 12,14. Thus, the resulting cell has a relatively very high resistance, which represents a logical bit value "0". In an alternative, preferred embodiment, however, the insulative layer 16 is beneficially a deposited or thermally grown, high quality dielectric (oxide or nitride).

Figure 1C:
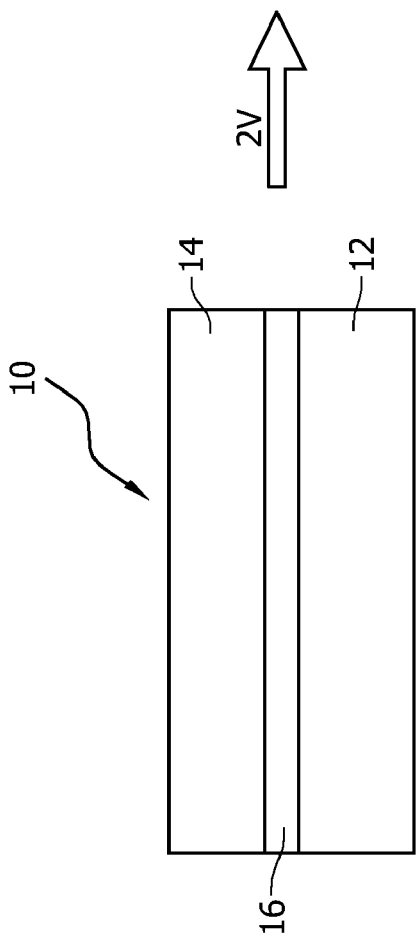
Figure 1D:
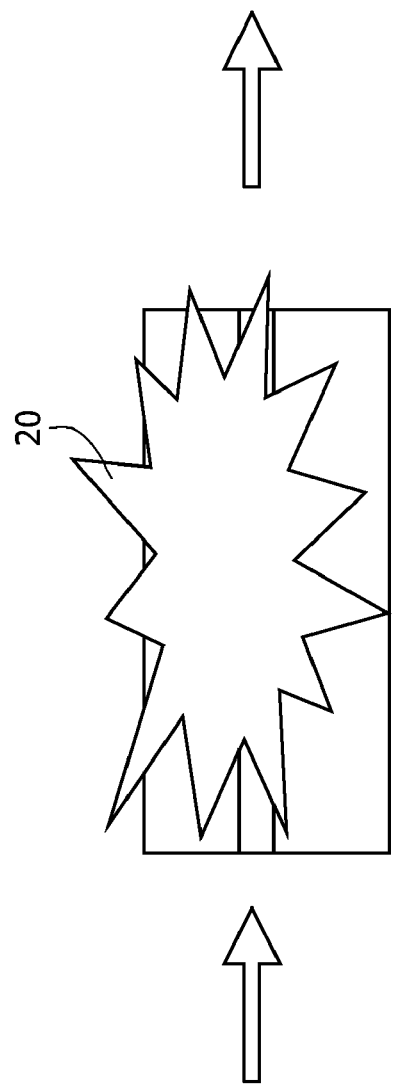
Figure 2A:
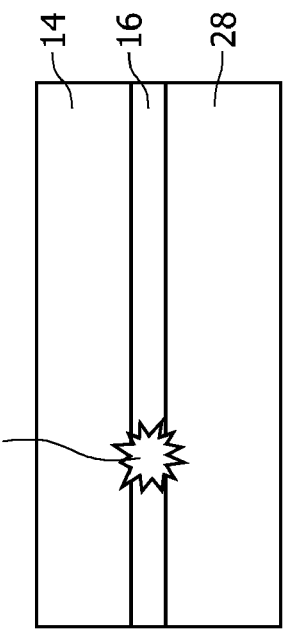
FIGS. 2A to 2D are schematic cross-sectional illustrations of a chemically assisted fuse for a memory cell according to a second exemplary embodiment of the present invention.
Figure 2B:
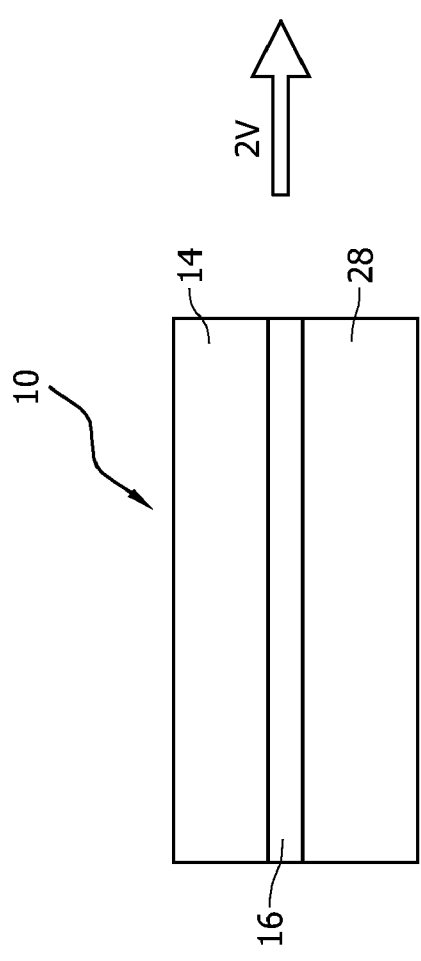
Figure 2C:
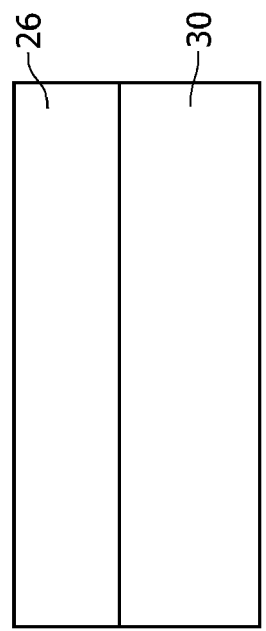
Figure 2D:
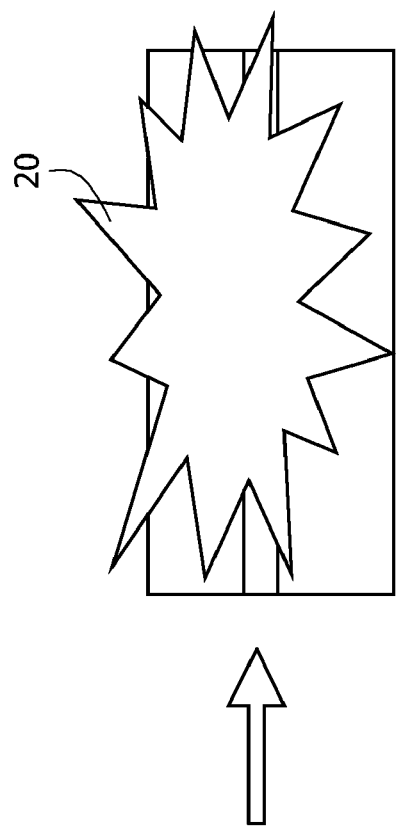
Figure 3A:
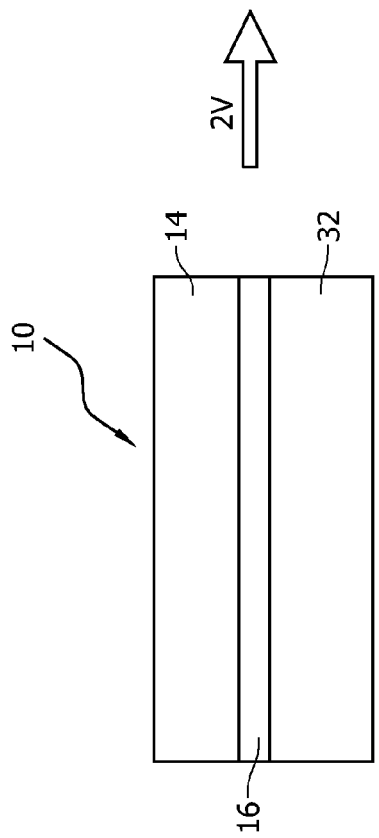
FIGS. 3A to 3D are schematic cross-sectional illustrations of a chemically assisted fuse for a memory cell according to a third exemplary embodiment of the present invention.
Figure 3B:
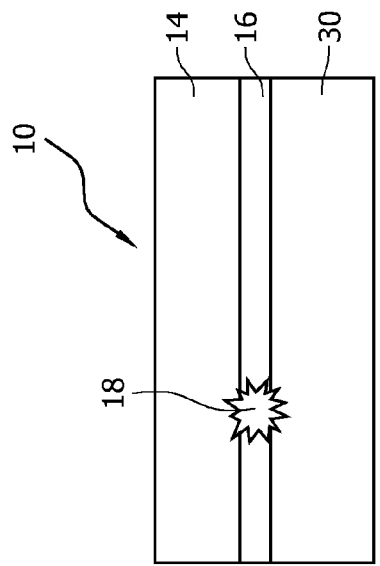
Figure 3C:
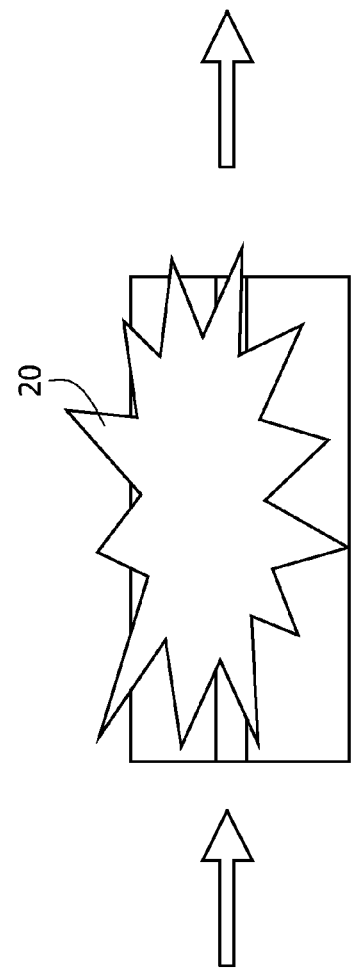
Figure 3D:
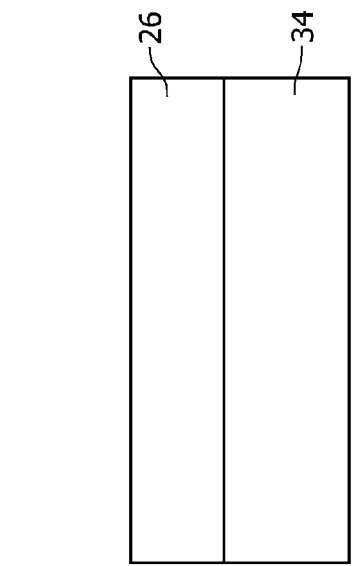

In order to program the cell 10, a small voltage (e.g. 2V) is applied across the cell, which results in a localized breakdown of the aluminium oxide layer 16. Thus, a short is created between the aluminium and $RuO_2$ layers 12, 14, which results in a local "hotspot" 18, as shown in FIG. 2b. This local hotspot 18 sets off an exothermic chemical reaction between the two conductive layers 12, 14, resulting in very high temperatures in the cell. By careful selection of geometries, $RuO_2$/Al ratios and/or addition of other elements, it is possible to create a short. In the example shown, and referring to FIGS. 1C and 1D of the drawings, in the area 20 where the heat of the exothermic reaction occurs, all of the oxygen atoms from the $RuO_2$ layer 14 and the $Al_2O_3$ layer 16 react with the aluminium in the area 22 to create a central isolating block of $Al_2O_3$, with conductive Al portions 24 on either side thereof. The remaining Ru portion 26, which is conductive, is in direct contact at the edges with the remaining Al portions 24, which are also conductive, so as to create the desired short. In this way, a relatively low resistance structure is created, which is representative of a logical bit value of "1", and the cell is programmed. It should be noted that this is a very schematic and simplified representation of the true result of the exothermic reaction within the memory cell during the programming process, and the illustration of the exemplary embodiments should not be seen as limiting with regard to the different pathways the reaction may proceed and the final cell microstructure that may occur. In fact, as will be apparent to a person skilled in the art, the result after the reaction is more likely to be a big "mess" with small particles of Ru and $Al_2O_3$ everywhere, and then the Ru particles form a conductive path from top to bottom. In other words, not only the oxygen atoms move but also the Al and Ru atoms.

In the exemplary embodiment illustrated in FIGS. 2A to 2D of the drawings, the Al layer is replaced by a layer 28 of an aluminium/silver (Al/Ag) alloy. Thus, when a small voltage (e.g. 2V) is applied across the cell 10, there is once again a localized breakdown of the $Al_2O_3$ layer 16, thereby creating a hotspot 18 which sets off an exothermic reaction between the two layers 14, 28. However, in this case, all of the oxygen atoms in the $RuO_2$ layer 14 and the $Al_2O_3$ layer 16 react with the aluminium in the Al/Ag layer 28 to form a conductive Ru layer 26 and a conductive $Al_2O_3$/Ag connect 30. Thus, the cell 10 now has a relatively low resistance, which is representative of a logical bit value "1".

It will be appreciated that $RuO_2$ is just one stable metal oxide that is suitable for use in the embodiment(s) described above and examples of other suitable compounds include doped $In_2O_3$, $NiO$, $ZnO$, $Ag_2O$ and $IrO_2$. It will be further appreciated that the Al layer can be replaced by any other suitable conductive, metallic layer, whether an alloy or otherwise. Further, although the conductive stable metal oxides referred to above are considered particularly suitable for use in a non-volatile programmable memory cell according to an exemplary embodiment of the invention, it is envisaged that other conductive compounds, including all stable metal compounds, would be suitable for use in the present invention. Thus, elements, such as S, N, etc. can replace O in all cases.

Referring to FIGS. 3A to 3D, in another multilayer stack example, an In(Sn) layer 32 is coated with an $RuO_2$ layer 14. A small voltage (e.g. 2V) is applied across the cell 10 so as to cause a localized breakdown of the $Al_2O_3$ layer 16 and create a hotspot 18, which once again sets off an exothermic reaction between the two layers 14, 32. As a result, the stack consists of a layer 34 of Sn doped $In_2O_3$, which is a well-known conductive oxide, with a layer 26 of Ru over it. The In(Sn) layer 32 may be alloyed with a third metal to increase the In(Sn) adhesion.

Referring to FIGS. 4A to 4D of the drawings, a non-volatile memory cell 10 according to yet another exemplary embodiment of the present invention comprises an aluminium layer 12 coated with a $RuO_2$ film 14. Again, a very thin native $Al_2O_3$ layer 16 is formed automatically and prevents a short between the aluminium and $RuO_2$ layers 12, 14. A layer 36 of (insulating) amorphous phase change material extends between the $RuO_2$ and aluminium layers 14, 12 and the resulting cell has a relatively very high resistance, which represents a logical bit value "0".

Once again, in order to program the cell 10, a small voltage is applied across it, which results in a localized breakdown of the aluminium oxide layer 16 and a short is created between the layers 12, 14 which results in a local "hotspot" 18. The local hotspot 18 sets off an exothermic chemical reaction between the two conductive layers 12, 14, resulting in relatively very high temperatures in the cell. The exothermic chemical reaction causes all of the oxygen atoms from the $RuO_2$ layer 14 to move the Al layer 12 resulting in an $Al_2O_3$ layer 22 coated with a Ru layer 26. In addition, the amorphous phase change layer 36 is crystallized by the high temperature to form a conductive crystalline phase change material 38, which creates a short from the conductive Ru layer 26 to the terminal. Thus, a relatively low-resistance structure is created, which is representative of a logical bit value of "1", and the cell is programmed. It will be appreciated that in an alternative structure, direct atomic heating of a similar amorphous phase change layer 36 would achieve the same result, but would require a much larger selection transistor.

Figure 5:
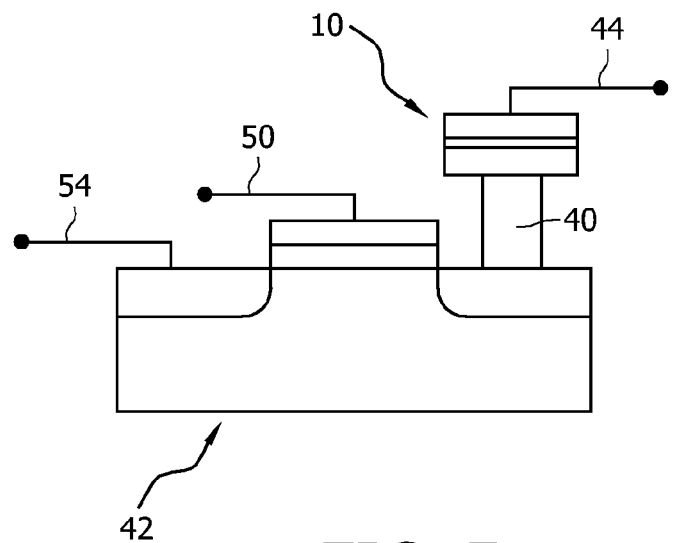
FIG. 5 is a schematic cross-sectional view of a memory cell including the chemically assisted fuse of FIGS. 2A to 2D.
Figure 6:
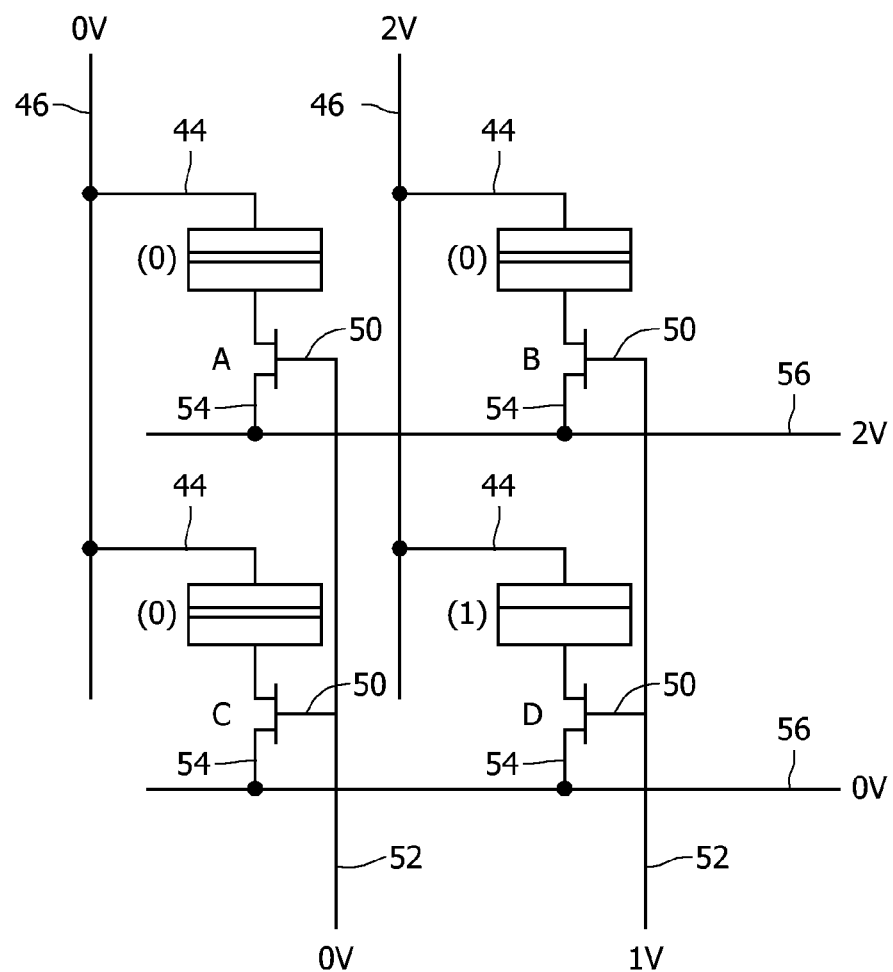
FIG. 6 is a schematic circuit diagram of a memory array including a plurality of memory cells of FIG. 5.

Referring to FIGS. 5 and 6 of the drawings, in a non-volatile memory cell 10 according to an exemplary embodiment of the invention, the chemically-assisted fuse 10 (in this case, as described with reference to FIGS. 2A to 2D) is simply deposited on top of a via 40 connected to a transistor 42, wherein the $RuO_2$ layer 14 is connected (via line 44) to the column lines 46 of a memory array 48, the transistor gate G is connected (via line 50) to the select lines 52 of the memory array 48, and the source S is connected (via line 54) to the row lines 56 of the memory array 48. The typical voltages for writing cell D are illustrated. The select lines 52 make sure only transistors B and D are selected and the column/row voltage is transferred to the memory cell. Only cell D has a voltage difference of 2V and will therefore react towards a conductive state. Read-out may be carried out at voltages of, typically, 0.5V.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of manufacturing a non-volatile memory cell having an anti-fuse connected to at least two terminals, the anti-fuse being programmable by applying a voltage across said terminals so as to change the resistance of the anti-fuse from a first, relatively high resistance representative of a first logical bit value to a second, relatively low resistance representative of a second logical bit value, the method comprising
    the step of forming a stack comprising a plurality of layers of materials including a first layer of a conductive material and a second layer of a conductive material with a layer of an insulative material therebetween; said second conductive material comprising a stable compound, said layer of the insulative material being such that the application of said voltage to said anti-fuse causes a localized breakdown of said insulative layer,
    the method further comprising the step of selecting said first and second layers of the conductive materials such that the heat created by said localized breakdown of said insulative material initiates an exothermic chemical reaction therebetween so as to generate a sufficient energy in said anti-fuse to change the state of at least a portion of one of said layers of said stack and create a stable short circuit between said terminals and reduce the resistance of said anti-fuse from said first, relatively high resistance to said second, relatively low resistance,
    wherein the anti-fuse further includes a layer of an amorphous phase change material provided between the terminals and positioned adjacent to the first and second layers of the conductive materials and the layer of the insulative material such that the layer of the amorphous phase change material directly contacts both the first and second layers of the conductive materials, wherein the amorphous phase change material is selected such that the energy generated in the anti-fuse as a result of the exothermic chemical reaction causes it to change to a conductive crystalline phase change material thereby creating a short circuit between the terminals.

2. A method according to claim 1, wherein the chemical energy generated as a result of said exothermic reaction is dependent on the difference in Gibbs Free Energy between the materials of the first and second conductive layers, and materials of the first and second conductive layers being selected accordingly.

3. A method according to claim 1, wherein said second conductive material is a stable oxide.

4. A method according to claim 3, wherein said second conductive material comprises $RuO_2$, $In_2O_3$, NiO, ZnO, $Ag_2O$ or $IrO_2$.

5. A method according to claim 3, wherein said insulative layer is a native or specially-made oxide or nitrate of a metal of the first conductive layer or a third material.

6. A method according to claim 1, wherein said first conductive layer comprises one or more metals.

7. A method according to claim 1, wherein as a result of the exothermic chemical reaction between the first and second conductive layers, a short circuit is created between the first and second layers.

8. A memory device comprising an array of memory cells according to claim 1, connected between select, row and column voltage lines.

9. A non-volatile memory cell having an anti-fuse connected to at least two terminals, the anti-fuse being programmable by applying a voltage between said terminals, so as to change the resistance of the anti-fuse from a first, relatively high resistance representative of a first logical bit value to a second, relatively low resistance representative of a second logical bit value, said anti-fuse comprising a stack comprising a plurality of layers of materials including a first layer of a conductive material coated with a second layer of a conductive material with an insulative layer therebetween, said second conductive material comprising a stable compound, wherein the application of said voltage to said anti-fuse causes a localized breakdown of said insulative layer, said first and second layers of the conductive materials being selected such that the heat created by said localized breakdown of said insulative layer initiates an exothermic chemical reaction therebetween so as to generate a sufficient energy in said anti-fuse to change the state or chemical composition of at least a portion of one of said layers of said anti-fuse and create a stable short circuit between said terminals and reduce the resistance of said anti-fuse from said first, relatively high, resistance to said second, relatively low resistance, wherein the anti-fuse further includes a layer of an amorphous phase change material provided between the terminals and positioned adjacent to the first and second layers of the conductive material and the layer of the insulative material such that the layer of the amorphous phase change material directly contacts both the first and second layers of the conductive materials, which the amorphous phase change material is selected such that the energy generated in the anti-fuse as a result of the exothermic chemical reaction causes it to change to a conductive crystalline phase change material thereby creating a short circuit between the terminals.

10. A memory element comprising a memory cell according to claim 9, deposited on a via connected to a transistor.

* * * * *